(12) United States Patent
Lin

(10) Patent No.: US 6,717,818 B1
(45) Date of Patent: Apr. 6, 2004

(54) CASE FOR PORTABLE STORAGE PERIPHERAL EQUIPMENT HAVING IMPROVED SHIELDING EFFECT

(75) Inventor: Yi-Sheng Lin, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/330,651

(22) Filed: Dec. 24, 2002

(30) Foreign Application Priority Data

Nov. 29, 2002 (TW) ............................................ 91219313

(51) Int. Cl.$^7$ .............................. H05K 5/00; H05K 5/04; H05K 5/06; H05K 9/00
(52) U.S. Cl. ........................ 361/753; 361/816; 361/818; 361/799; 361/756; 361/759; 439/945; 174/35 R
(58) Field of Search .................................. 361/683–686, 361/704, 726, 728, 732, 737, 740, 741, 747, 752, 753, 756, 759, 799, 800–802, 816, 818, 825; 174/35 R, 35 GC, 35 MS, 50, 50.52, 50.51, 51, 66; 211/26, 41.17; 312/223.2; 439/95, 945, 607; 360/69, 98.04

(56) References Cited

U.S. PATENT DOCUMENTS

| | | | | |
|---|---|---|---|---|
| 4,323,979 A | * | 4/1982 | Johnston | 361/684 |
| 4,649,461 A | * | 3/1987 | Matsuta | 361/799 |
| 4,833,554 A | * | 5/1989 | Dalziel et al. | 360/98.04 |
| 4,926,291 A | * | 5/1990 | Sarraf | 361/685 |
| 5,041,924 A | * | 8/1991 | Blackborow et al. | 360/69 |
| 5,206,796 A | * | 4/1993 | Thompson et al. | 361/818 |
| 5,214,567 A | * | 5/1993 | Feightner et al. | 361/685 |
| 5,258,888 A | * | 11/1993 | Korinsky | 361/704 |
| 5,388,030 A | * | 2/1995 | Gasser et al. | 361/818 |
| 5,459,640 A | * | 10/1995 | Moutrie et al. | 361/707 |
| 5,548,480 A | * | 8/1996 | Rudi et al. | 361/685 |
| 5,604,662 A | * | 2/1997 | Anderson et al. | 361/685 |
| 5,652,697 A | * | 7/1997 | Le | 361/788 |
| 5,726,864 A | * | 3/1998 | Copeland et al. | 361/800 |
| 5,740,019 A | * | 4/1998 | Lee | 361/759 |
| 5,886,869 A | * | 3/1999 | Fussell et al. | 361/685 |
| 6,053,771 A | * | 4/2000 | Hood, III et al. | 439/607 |
| 6,088,231 A | * | 7/2000 | Fajardo | 361/737 |
| 6,122,178 A | * | 9/2000 | Andrews et al. | 361/800 |
| 6,188,571 B1 | * | 2/2001 | Roganti et al. | 361/685 |
| 6,206,728 B1 | * | 3/2001 | Krehbiel et al. | 439/607 |
| 6,219,239 B1 | * | 4/2001 | Mellberg et al. | 361/704 |
| 6,236,574 B1 | * | 5/2001 | Han | 361/816 |
| 6,295,567 B1 | * | 9/2001 | Bassman et al. | 710/104 |
| 6,442,020 B1 | * | 8/2002 | Liu et al. | 361/683 |
| 6,462,958 B2 | * | 10/2002 | Ogata | 361/800 |
| 6,512,671 B1 | * | 1/2003 | Okano et al. | 361/686 |
| 6,560,097 B2 | * | 5/2003 | Naruo et al. | 361/685 |
| 6,567,360 B1 | * | 5/2003 | Kagawa | 369/75.1 |

* cited by examiner

*Primary Examiner*—Phuong T. Vu
(74) *Attorney, Agent, or Firm*—Wei Te Chung

(57) ABSTRACT

A case (1) includes a case body consisting of a top cover (10) and a bottom cover (20), a printed circuit board module (PCB module, 40) and a shielding member (50). The case body defines a receiving space (60) for receiving a portable storage peripheral equipment. The PCB module is received in the receiving space and comprising a printed circuit board (42) and an electrical connector (44) mounted on the printed circuit board. The shielding member is attached to an inner surface of the top cover and electrically connects with a grounding circuit trace of the printed circuit board. A copper foil (21) is attached on an inner surface of the bottom cover aligning with the PCB module and electrically connects with a resilient arm (56) of the shielding. The case has an improved shielding effect for effectively eliminating noise.

4 Claims, 6 Drawing Sheets

CASE FOR PORTABLE STORAGE PERIPHERAL EQUIPMENT HAVING IMPROVED SHIELDING EFFECT

CROSS-REFERENCE TO RELATED APPLICATION

This patent application is related to a co-pending application of U.S. patent application Ser. No. 29/169,745, filed Oct. 24, 2002, entitled "CASE FOR PORTABLE STORAGE PERIPHERAL", and other contemporaneously filed applications entitled "CASE FOR PORTABLE STORAGE PERIPHERAL EQUIPMENT", entitled "CASE FOR RECEIVING PORTABLE STORAGE PERIPHERAL EQUIPMENT, and entitled "CASE FOR PORTABLE STORAGE PERIPHERAL EQUIPMENT HAVING CABLE ASSEMBLY WITH STRAIN RELIEF", all invented by the same inventor, and assigned to the same assignee as the present application.

BACKGROUND OF THE INVENTION

1. Field of the Invention

The present invention relates to a case for portable storage peripheral equipment, and particularly to a case receiving a portable storage peripheral equipment of a notebook computer which has an improved shielding effect.

2. Description of Related Art

Following the popularity of the data processing machines, i.e., computers, or serves, information processing with the machine, is increased enormously. Generally, the information is stored in an internal store equipment, such as a hard disk, a floppy disk or a compact disc of a computer. However, such internal stores are not satisfied with requirements of the development that the computer becomes portable and low profile. The external portable storage peripheral equipment is developed and becomes more and more popular.

Generally, the external portable storage peripheral equipment is received in a case. A printed circuit board module (PCB module) is designed in the case with an electrical connector mounted thereon for mating with a complementary connector mounted on a front portion of the portable storage peripheral equipment. The case further comprises a cable assembly connected with the PCB module and extending outside from the case with a cable connector at a free end of the cable for mating with a device connector mounted on a mother board of the notebook computer for providing signal transmission. However, noise may interfere with the electronic complements which affect the signal transmission. The noise generally comprises electrostatic discharge (ESD) and electro magnetic interference (EMI).

To solve the problem, a shielding member is designed to be assembled in the case for shielding the electronic complements to suppress and eliminate noise. For such a shielding member, grounding means are important factors which directly result the shielding effect.

Hence, a case for portable storage peripheral equipment having an improved shielding member is required to overcome the disadvantages of the related art.

SUMMARY OF THE INVENTION

Accordingly, an object of the present invention is to provide a case for portable storage peripheral equipment having an improved shielding effect.

A second object is to provide a case for portable storage peripheral equipment having a shielding member which has a good grounding means.

In order to achieve the objects set forth, a case in accordance with the present invention is provided. The case includes a case body consisting of a top cover and a bottom cover, a printed circuit board module (PCB module) and a shielding member. The case body defines a receiving space for receiving a portable storage peripheral equipment. The PCB module is received in the receiving space and comprising a printed circuit board (PCB) and an electrical connector mounted on the PCB. The shielding member is attached to an inner surface of the top cover and electrically connects with a grounding circuit trace of the PCB. A copper foil is attached on an inner surface of the bottom cover aligning with the PCB module and connects with a resilient arm of the shielding member. The case has an improved shielding effect for effectively eliminating noise.

Other objects, advantages and novel features of the invention will become more apparent from the following detailed description when taken in conjunction with the accompanying drawings.

DETAILED DESCRIPTION OF THE INVENTION

Figure 1:
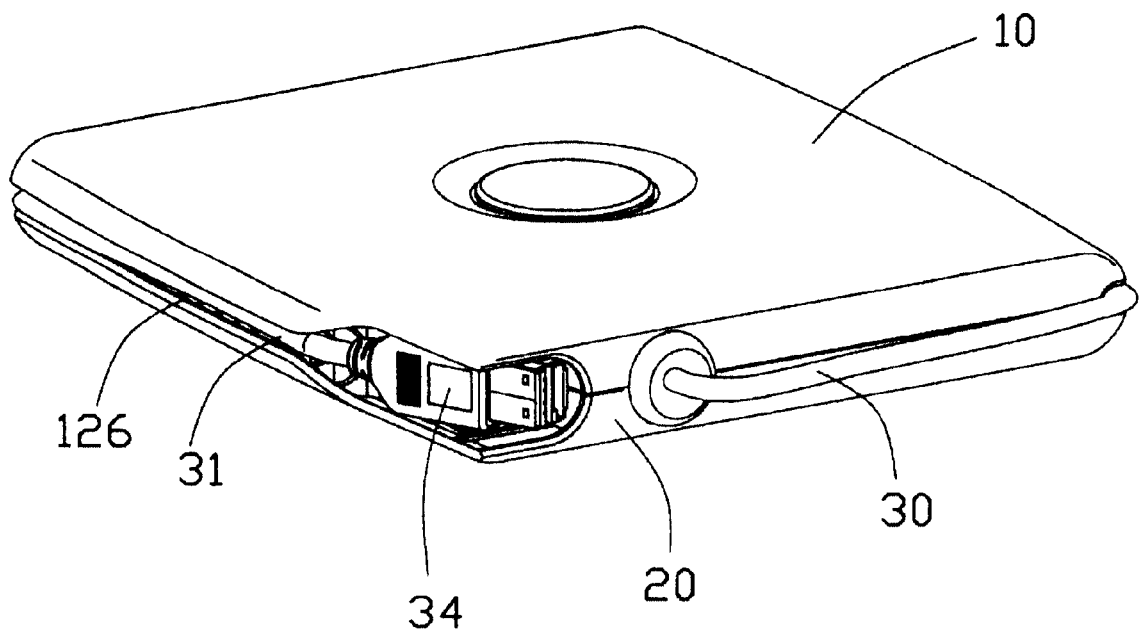
FIG. 1 is an assembled, perspective view of a case for portable storage peripheral equipment in accordance with the present invention with a cable assembly retained in receiving channels thereof.
Figure 2:
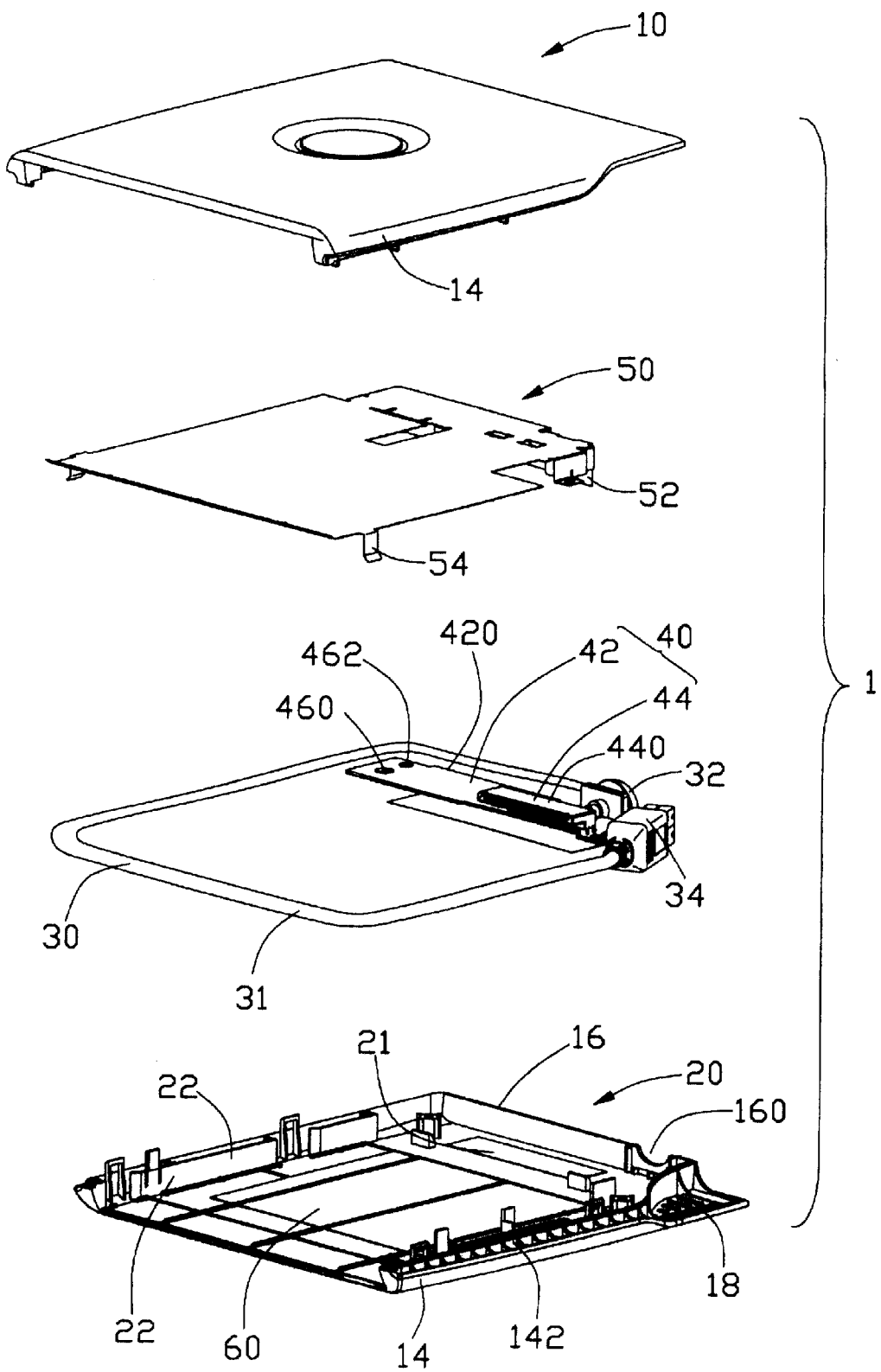
FIG. 2 is an exploded, perspective view of the case for portable storage peripheral equipment of FIG. 1.

Referring to FIGS. 1–2, a case 1 for portable storage peripheral equipment in accordance with the present invention is generally rectangular in shape. The case 1 comprises a case body consisting of a top cover 10 and a bottom cover 20, a cable assembly 30, a printed circuit board module 40 (PCB module), and a shielding member 50. The top cover 10 and the bottom cover 20 are assembled together and a receiving space 60 is thus defined therebetween. The PCB module 40 and the shielding member 50 are assembled in the receiving space 60. A portable storage peripheral equipment (not shown), i.e. a portable hard disk, a floppy disk or a compact disc, can be accommodated in the receiving space 60 for providing a signal transmission with a notebook computer by the PCB module 40 and the cable assembly 30.

Figure 3:
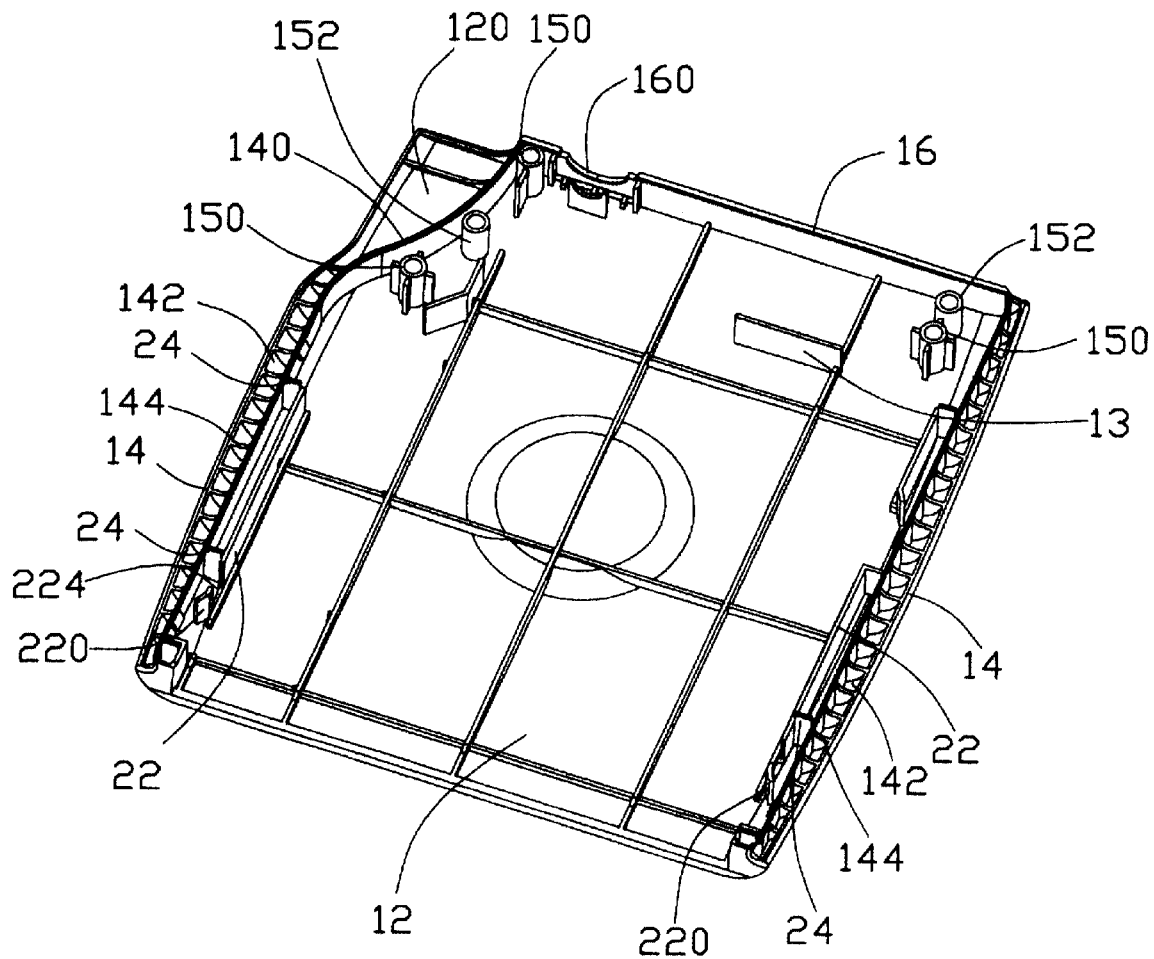
FIG. 3 is a bottom perspective view of a top cover of the case for portable storage peripheral equipment of FIG. 1.
Figure 4:
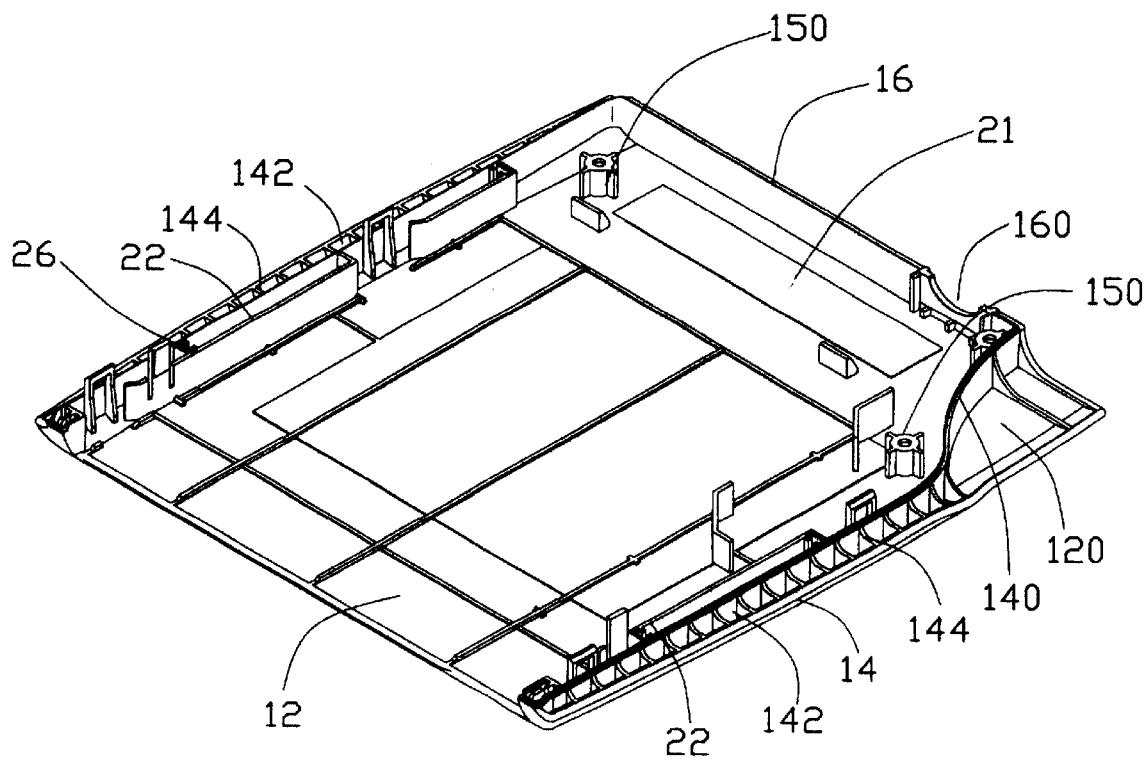
FIG. 4 is a top perspective view of a bottom cover of the case for portable storage peripheral equipment of FIG. 1.

Also referring to FIGS. 2–4, the top cover 10 has a similar configuration with the bottom cover 20 and opposite to the top cover 10. Each cove 10, 20 has a flat board 12, a pair of sidewalls 14 respectively extending curvely and outwardly from the flat board 12, and a front wall 16 extending from a front side of the flat board 12. A positioning bar 13 extends downwardly from the flat board 12 of the top cover 12. A copper foil 21 is attached to the flat board 12 of the bottom cover 20 adjacent to the front wall 16. A plurality of first posts 150 respectively protrudes from each flat board 12. Each first post 150 of the top cover 10 is opposite to a corresponding first post 150 of the bottom cover 20. A plurality of second posts 152 extends downwardly from the flat board 12 of the top cover 10. Each second posts 152 defines a screw hole therein corresponding to a second retaining hole 462 of the printed circuit board 42 which will be described hereinafter.

One of the sidewalls 14 has a transitional part 140 adjacent to the front wall 16. The transitional part 140 deflects towards a center of the flat board 12 relative to the other part of the sidewall 14 and a recess 120 is thus defined by the flat board 12 and the transitional part 140. A pair of cushions 18 is respectively attached on bottom surfaces of the recesses 120 of the top cover 10 and the bottom cover 20. Each front wall 16 defines a hemicycle orifice 160 adjacent to the recess 120.

Each sidewall 14 of the covers 10, 20 defines a groove 142 therein. A plurality of arcuate ribs 144 protrudes equably into the corresponding groove 142. Each flat board 12 of the top cover 10 and the bottom cover 20 protrudes a plurality of baffles 22 parallel to the sidewall 14 thereof adapted for engaging with corresponding portable storage peripheral equipment. Each baffle 22 has a guiding portion 220 at a front end thereof and inclining towards an adjacent sidewall 14. The top cover 10 forms a plurality of locking flakes 24 protruding downwardly therefrom, as shown in FIG. 3. The bottom cover 20 defines a corresponding number of locking apertures 26 for snugly receiving the locking flakes 24 of the top cover 10, best shown in FIG. 4.

The PCB module 40 includes a printed circuit board 42 and an electrical connector 44 assembled thereon. The electrical connector 44 is enclosed by an outer shield 440. The printed circuit board 42 has a projection 420 protruding forwardly. The printed circuit board 42 defines a plurality of first retaining holes 460 each aligning with a first post 150 and second retaining holes 462 with inner walls thereof electrically connecting with a grounding circuit trace of the printed circuit board 42 and each second retaining hole 462 aligning with a second post 152 at the lateral sides of the printed circuit board 42. The cable assembly 30 has a cable 31. The cable 31 electrically connects with the printed circuit board 42 generally by soldering technology which is known to persons skilled in the art and the detailed description is omitted here. A retaining portion 32 of the cable 31 is designed adjacent the front wall 16 for providing a retention between the cable 32 and the case body. The cable 31 extends beyond the front wall 16 of the case 1 with a cable connector 34 at a free end thereof adapted for mating with a device connector mounted on a mother board of the notebook computer.

Figure 5:
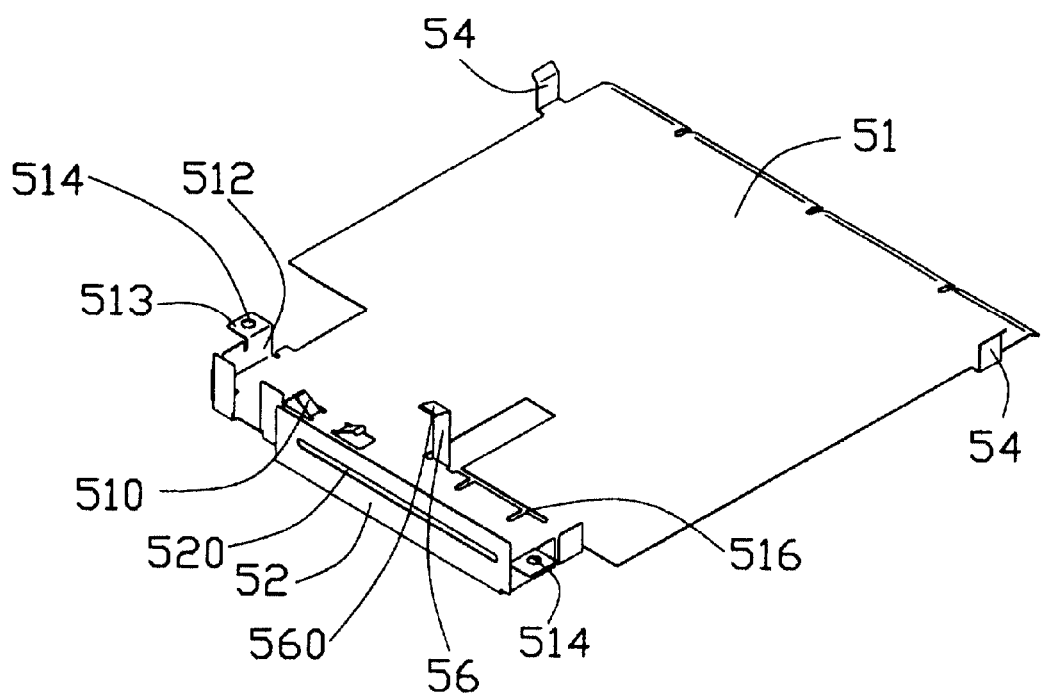
FIG. 5 is a bottom perspective view of a shielding member of the case for portable storage peripheral equipment of FIG. 1.

Referring to FIG. 5, the shielding member50, generally stamped from metal or other electrically conductive materials, has a configuration and dimension for nicely abutting against the flat board 12 of the top cover. The shielding member 50 has a flat body 51 and a front wall 52 extending upwardly from a front side of the flat body 51. The front wall 52 defines a horizontal slit 520. A pair of resilient taps 510 is stamped from the flat body 51 adjacent to the front wall 52. A plurality of leg portions 512 and retaining legs 54 respectively extends upwardly from the front, rear sides of the flat body 51. Each leg portion 512 is L-shaped and has an engaging portion 513 bending outwardly at a top end thereof. Each engaging portion 513 engages with a corresponding second post 152 of the top cover 10 and defines a hole 514 for a corresponding screw 17 (shown in FIG. 6) extending therethrough. A resilient arm 56 is stamped and extends upwardly from the flat body 51 adjacent to the pair of resilient taps 510. The resilient arm 56 has a contact portion 560 at a top end thereof and bending towards the front wall 52. The flat body 51 defines a slit 516 adjacent to the resilient arm 56.

Figure 6:
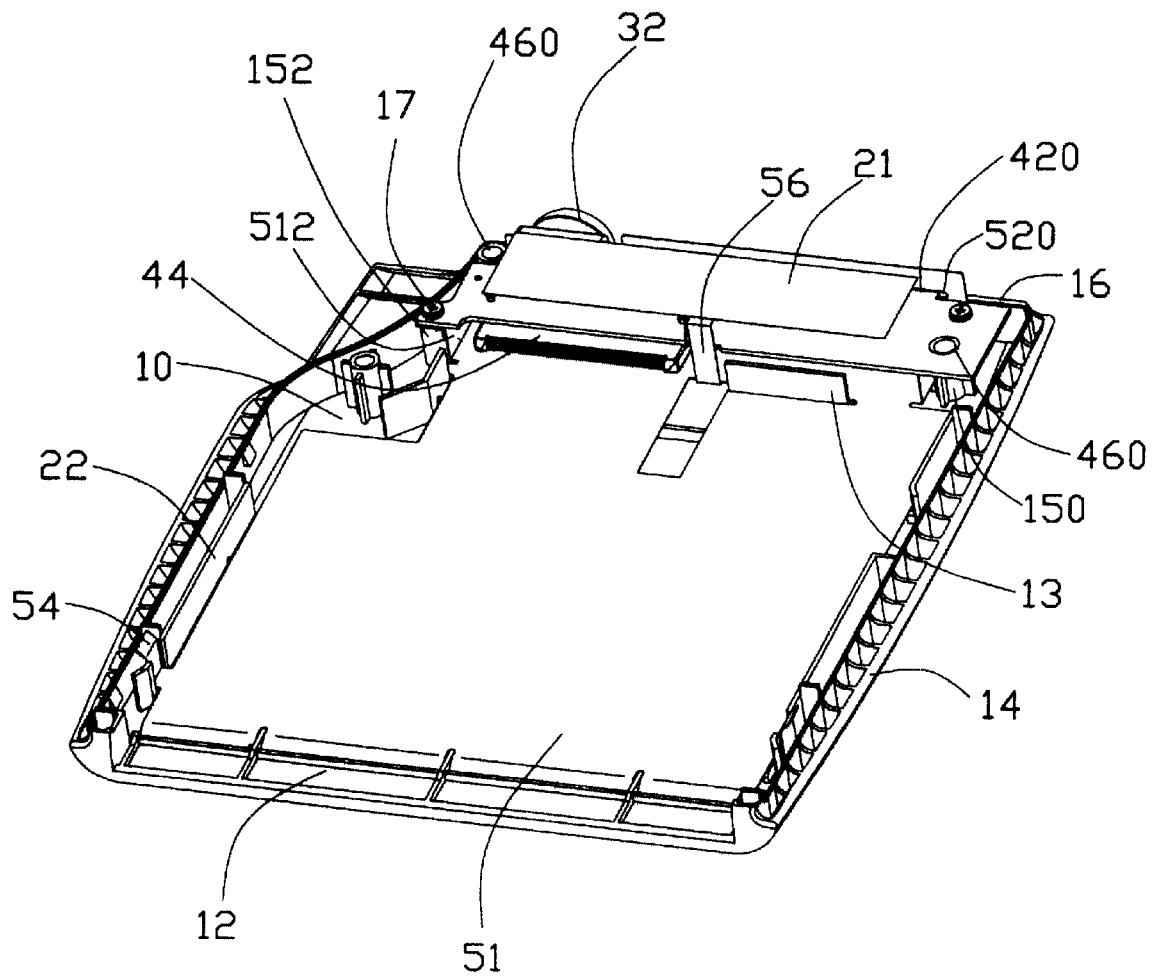
FIG. 6 is an assembled, bottom perspective view of the case for portable storage peripheral equipment with a bottom cover and a cable assembly removed.

In assembly, referring to FIGS. 2–3 and FIG. 6, the shielding member 50 is assembled to an inner surface of the flat board 12 of the top cover 10 with the front wall 52 thereof abutting against the front wall 16 of the top cover 10. The positioning bar 13 of the top cover 10 extends through the slit 516 of the body 51 for providing a retention therebetween. Each second retaining post 152 of the top cover 10 aligns with a leg portion 512 with the screw hole thereof aligning with the hole 514. The PCB module 40 is assembled in the receiving space 60 adjacent to the front wall 16. The outer shield 440 of the electrical connector 44 electrically and mechanically connects with the pair of resilient taps 510 for providing a grounding path therebetween. The projection 420 of the printed circuit board 42 is inserted in the horizontal slit 520 of the front wall 52 of the shielding member 50. The hole 514 of the engaging portion 513 of the leg portion 512 aligns with a retaining hole 462 of the printed circuit board 42 and thereby providing a grounding path by the screw 17 extending therethrough. Further, the screw 17 extends ordinally through the retaining hole 462 of the printed circuit board 42 and the hole 514 of the shielding member50 and is retained in a corresponding screw hole of the second retaining post 152 thereby fastening the printed circuit board module 40 and the shielding member50 in the receiving space 60.

Subsequently, the locking flakes 24 of the top cover 10 are inserted in corresponding locking apertures 26 of the bottom cover 20. The top cover 10 and the bottom cover 20 are thus fastened with each other. The contact portion 560 of the resilient arm 56 of the shielding member 50 abuts against the copper foil 21 attached to the bottom cover 20. Further, the hemicycle orifices 160 of the top cover 10 and the bottom cover 20 inosculate to each other to provide a circular aperture (not labeled). The retaining portion 32 of the cable 31 extends through the circular aperture. The grooves 142 of the sidewalls 14 of the top cover 10 and the bottom cover 20 confront to each other and a receiving channel 126 is thus formed by the pair of grooves 142. Similarly, the recesses 120 of the top cover 10 and the bottom cover 20 confront to each other for providing a retaining cavity 128. The cable 31 extending out of the case 1 surrounds the case body and is nicely received in the receiving channels 126 of the case 1 with the arcuate ribs 144 supporting the jacket of the cable 31. The cable connector 34 is snugly retained in the retaining cavity 128.

Referring to FIG. 5, in use, the portable storage peripheral equipment is inserted into the receiving space 60 with a complementary connector thereof mating with the electrical connector 44 of the PCB module 40 therein. The cable 31 extends out of the case 1 and the cable connector 34 mates with a device connector of the computer. The signal transmission and conversion between the portable storage peripheral equipment and the computer is thus accomplished by the PCB module 40 and the cable assembly 30. The pair of resilient taps 510 of the shielding member50 elastically engages with the outer shield 440 for providing a grounding path therebetween. At the same time, the hole 514 of the engaging portion 513 of the leg portion 512 aligns with to a corresponding retaining hole 462 electrically connecting with a grounding circuit trace of the printed circuit board 42 and thereby providing a grounding path by the screw 17 extending therethrough. So, the multitudinous grounding means is provided between the shielding member 50 and the printed circuit board 42 which can effectively eliminate noise. Furthermore, the copper foil 21 attached to the bottom cover 20 electrically contacts with the contact portion 560 of the resilient arm 56 of the shielding member 50. The printed circuit board module 40 has two shielding member devices (the shielding member 50 and the copper foil 21) respectively surrounding the printed circuit board 42 from the top and bottom sides thereof. The case 1 has an improved shielding effect and can eliminate noise effectively, especially suppress the electro magnetic interference (EMI) for assuring the signal transmission therebetween.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A case for portable storage peripheral equipment comprising:
    a case body consisting of a first cover and a second cover which together define a receiving space for receiving a portable storage peripheral equipment
    a printed circuit board module (PCB module) provided in the receiving space and comprising a printed circuit board (PCB) and an electrical connector mounted on the PCB adapted for mating with a complementary connector mounted on the portable storage peripheral equipment;
    shielding member attached to an inner surface of the first cover and electrically connecting with a grounding circuit trace of the PCB wherein the shielding member comprises a body extending flatly, the shielding member defines a pair of resilient taps extending perpendicularly to the body for electrically connecting with an outer shield of the electrical connector of the PCB, and the shielding member further comprises a plurality of leg portions protruding perpendicularly to the body, each leg portion having an engaging portion defining a hole at a center thereof and wherein the PCB defines a plurality of retaining holes with inner walls thereof electrically connecting with the grounding circuit trace on the PCB and each of the retaining holes respectively aligns with a corresponding hole of the engaging portion of the leg portion of the shielding member and is fastened together by a screw extending therethrough and wherein the first cover forms a plurality of posts each defining a screw hole therein, the screw extending through the retaining hole of the PCB and the hole of the shielding member is retained in the screw hole of the post, and wherein a copper foil is attached on an inner surface of the second cover aligning with the PCB module and the shielding member comprises a resilient arm extending therefrom, the resilient arm having a contact portion electrically connecting with the copper foil.

2. The case for portable storage peripheral equipment as claimed in claim 1, wherein the shielding member comprises a front wall extending perpendicularly to the body and abutting against a front wall of the case body.

3. The case for portable storage peripheral equipment as claimed in claim 2, wherein the front wall of the shielding member defines a slit, and the PCB has a projection inserted in the slit.

4. The case for portable storage peripheral equipment as claimed in claim 1, wherein the first cover forms a plurality of locking flakes protruding downwardly therefrom, the second cover defines a corresponding number of locking apertures snugly receiving the locking flakes therein so as to fasten the first cover and the second cover together.

* * * * *